US012598723B2

(12) United States Patent
Pan et al.

(10) Patent No.: US 12,598,723 B2
(45) Date of Patent: Apr. 7, 2026

(54) HEAT CONDUCTION PLATE ASSEMBLY STRUCTURE

(71) Applicant: KUAN DING INDUSTRIAL CO., LTD., New Taipei City (TW)

(72) Inventors: Kuan-Da Pan, New Taipei City (TW); Ming-Cheng Peng, New Taipei City (TW)

(73) Assignee: KUAN DING INDUSTRIAL CO., LTD., New Taipei City (TW)

( * ) Notice: Subject to any disclaimer, the term of this patent is extended or adjusted under 35 U.S.C. 154(b) by 200 days.

(21) Appl. No.: 18/244,212

(22) Filed: Sep. 8, 2023

(65) Prior Publication Data

US 2024/0365514 A1 Oct. 31, 2024

(30) Foreign Application Priority Data

Apr. 28, 2023 (TW) .................................. 112204115

(51) Int. Cl.
*H05K 7/20* (2006.01)
(52) U.S. Cl.
CPC .................................. *H05K 7/2039* (2013.01)
(58) Field of Classification Search
CPC ....................................................... H01L 23/42
See application file for complete search history.

(56) References Cited

U.S. PATENT DOCUMENTS

2005/0173792 A1* 8/2005 Sheu ...................... H01L 23/367
257/E23.102
2022/0375813 A1* 11/2022 Huang ................ H01L 23/3675

FOREIGN PATENT DOCUMENTS

TW M417597 U * 12/2011

* cited by examiner

*Primary Examiner* — Jianying C Atkisson
*Assistant Examiner* — Khaled Ahmed Ali Al Samiri
(74) *Attorney, Agent, or Firm* — HDLS IPR SERVICES; Chun-Ming Shih

(57) ABSTRACT

A heat conduction plate assembly structure (1) includes a heat conduction plate (10) and a buffer pad (20). The heat conduction plate (10) includes a platform (11). The platform (11) includes an arc surface (111) attached to the heat-generating component (2) and an overflow slot (112) located on a side of the arc surface (111). The buffer pad (20) is fixed on the platform (11) and surrounds an outer side of the overflow slot (112). Therefore, a heat conduction plate assembly structure (1) with a desirable thermal conduction effect is provided to prevent the thermal conducting medium (50) from overflowing.

7 Claims, 11 Drawing Sheets

HEAT CONDUCTION PLATE ASSEMBLY STRUCTURE

BACKGROUND OF THE DISCLOSURE

Technical Field

The technical field relates to a heat conduction structure, and more particularly relates to a heat conduction plate assembly structure.

Description of Related Art

A heat dissipation structure is usually attached to a heat-generating component through a heat conduction plate to conduct the heat generated from the electronic component to the heat dissipation structure and improve the heat dissipation efficiency. However, due to the roughness or unevenness existed on the surface of the heat-generating component rather than a flat plane, when the heat-generating component contacts with the thermal conductive plate, gaps may exist between therebetween, so that the two components may not be well attached. Additionally, the presence of this gap may retain air and prevents the thermal paste from being filled, thereby reducing thermal efficiency.

Moreover, the heat conduction plate of the related art is coated with a heat conduction medium when attaching to a heat-generating component to improve the heat conduction effect therebetween. However, an excess heat conduction medium may result in overflow, and the heat conduction plate may be vertically positioned, causing the heat conduction medium to flow out. In this regard, how to avoid the overflow of the heat conduction medium is a problem that needs to be solved.

In view of the above drawbacks, the inventor proposes this disclosure based on his expert knowledge and elaborate researches in order to solve the problems of related art.

SUMMARY OF THE DISCLOSURE

One object of this disclosure is to provide a heat conduction plate assembly structure, in which the heat conduction plate includes a platform and an arc surface for attaching to a heat-generating component to avoid gaps when contacting with the heat-generating component, and thereby improving the heat conduction effect.

This disclosure is a heat conduction plate assembly structure including a heat conduction plate and a buffer pad. The heat conduction plate includes a platform. The platform includes an arc surface attached to the heat-generating component and an overflow slot located on a side of the arc surface. The buffer pad is fixed on the platform and surrounds an outer side of the overflow slot.

One object of this disclosure is to provide a heat conduction plate assembly structure, in which the heat conduction plate includes an overflow slot disposed on a side of the arc surface to prevent overflowing of the heat conduction medium coated on the arc surface.

In comparison with the related art, the heat conduction plate of this disclosure includes a platform, and the platform includes an arc surface attached to the heat-generating component and an overflow slot located on a side of the arc surface. Additionally, the buffer pad is fixed on the platform and surrounds an outer side of the overflow slot. Therefore, the heat conduction plate may effectively adhere to the heat-generating component through the arrangement of the arc surface. As a result, gaps may be eliminated between the heat conduction plate and the heat-generating component, thus the heat conduction effect is improved. Additionally, the excess heat conduction medium coated on the arc surface may overflow into the overflow slot to avoid contaminating other components, and the practicability of this disclosure is increased.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
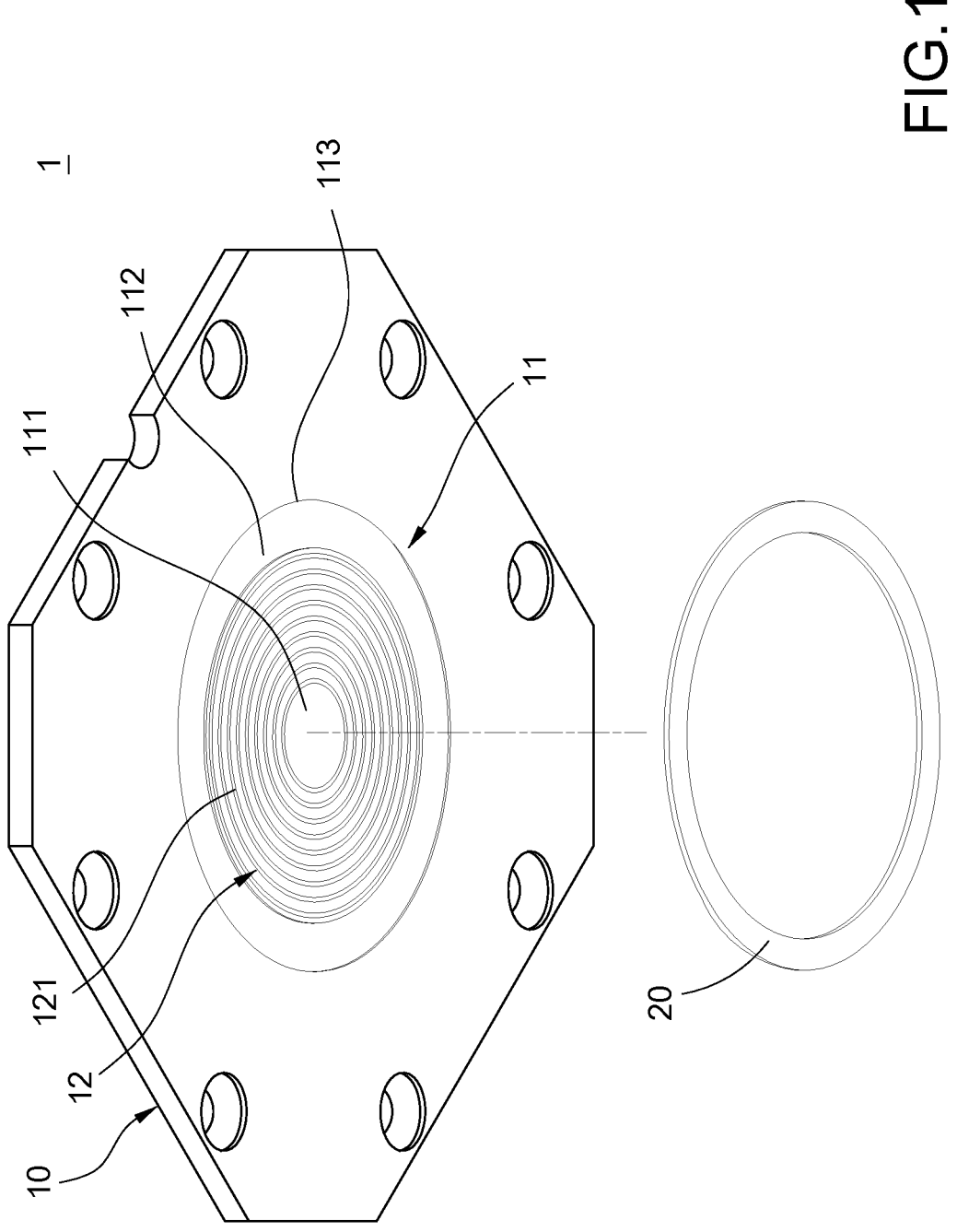
FIG. 1 is a perspective exploded schematic view of the heat conduction plate assembly structure in this disclosure.
Figure 2:
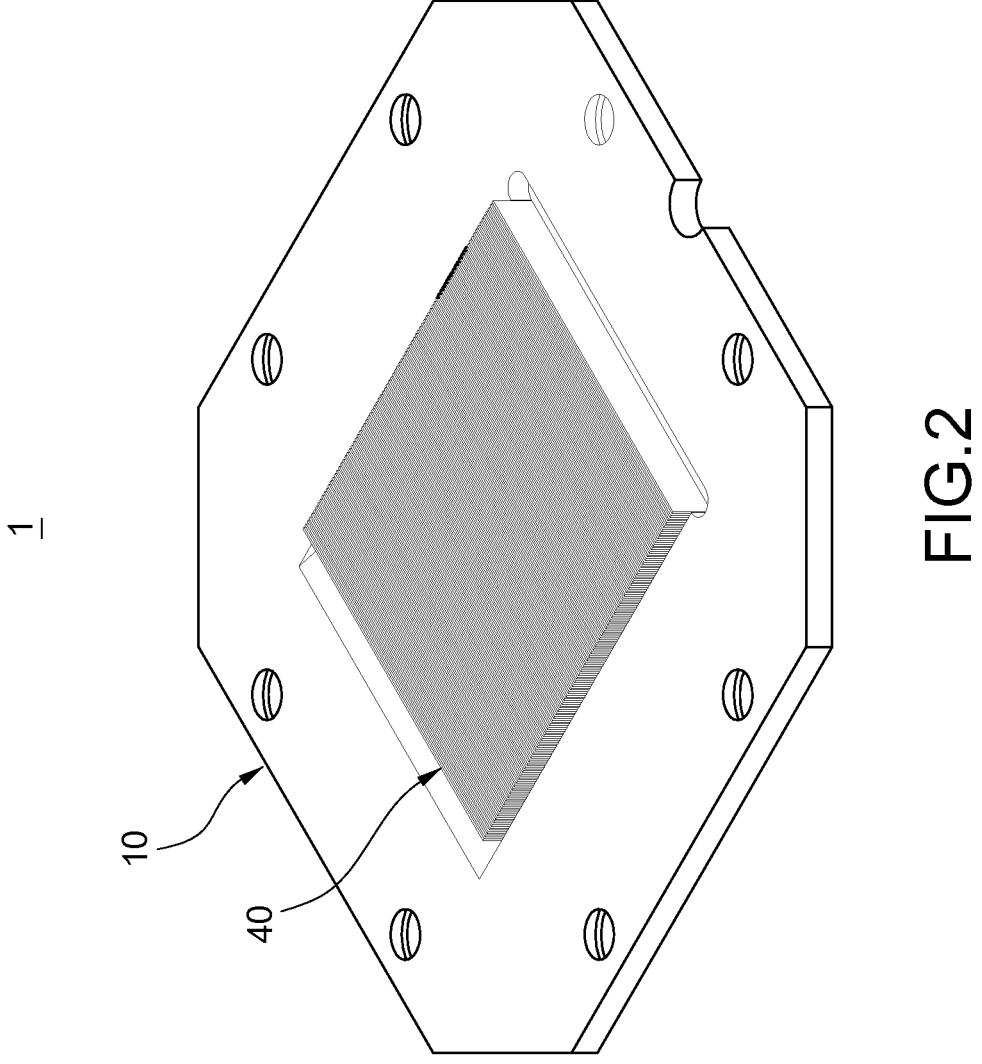
FIG. 2 is a perspective schematic view of the heat conduction plate assembly structure in this disclosure.
Figure 3:
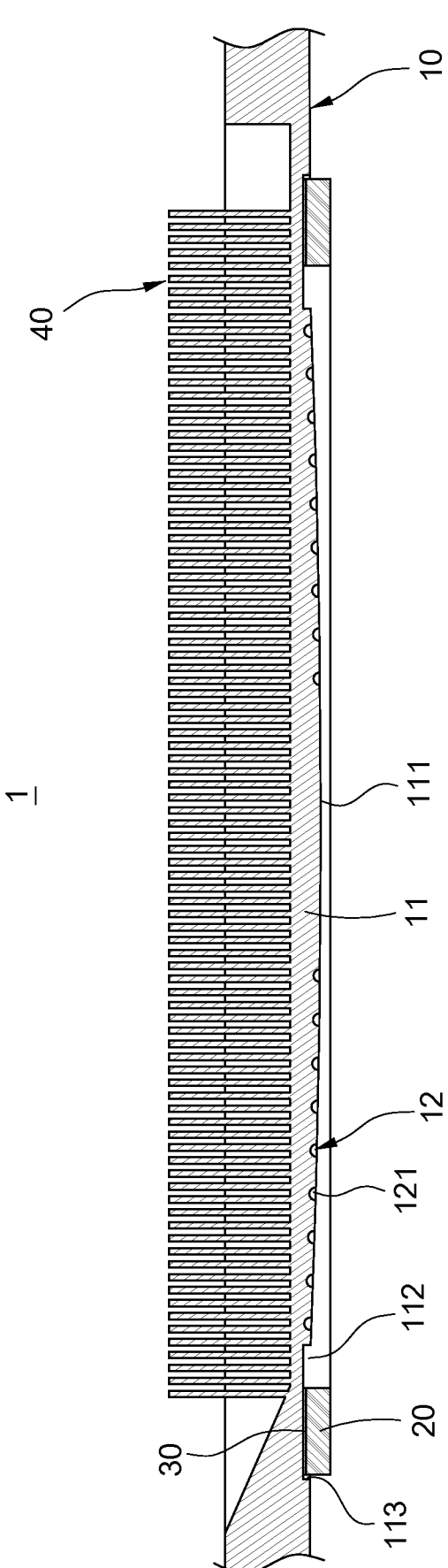
FIG. 3 is a cross-sectional view of the heat conduction plate assembly structure in this disclosure.

Please refer to FIG. 1 to FIG. 3, which are a perspective exploded schematic view of the heat conduction plate assembly structure, a perspective schematic view of the heat conduction plate assembly structure and a cross-sectional view of the heat conduction plate assembly structure in this disclosure. This disclosure is a heat conduction plate assembly structure 1 including a heat conduction plate 10 and a buffer pad 20. The buffer pad 20 is combined on the heat conduction plate 10 to constitute the heat conduction plate assembly structure 1.

The heat conduction plate 10 is a plate made of a material with desirable thermal conductivity. The heat conduction plate 10 includes a platform 11. The platform 11 includes an arc surface 111 and an overflow slot 112 located on a side of the arc surface 111.

In one embodiment of this disclosure, a plurality of grooves 12 are disposed on the arc surface 111. The grooves 12 includes concentric annular grooves 121 of different sizes. Furthermore, the platform 11 includes a positioning groove 113.

Moreover, the buffer pad 20 is a pad made of a material with a buffering effect, such as foam, etc. The buffer pad 20 is fixed on the platform 11 and surrounds the outer side of the overflow slot 112. In this embodiment, the buffer pad 20 is disposed in the positioning groove 113. Further, the buffer pad 20 is combined in the positioning groove 113. A part of the positioning groove 113 is reserved on the inner side of the buffer pad 20, and that part is defined as the overflow slot (referring to FIG. 3).

Specifically, the overflow slot 112 and the buffer pad 20 are arranged correspondingly in a circular manner. In this embodiment, the overflow slot 112 is configured as a circular ring groove. Additionally, the buffer pad 20 is configured as a circular pad.

Moreover, the heat conduction plate assembly structure 1 further includes a glue 30. The buffer pad 20 is combined on the platform 11 through the glue 30. Additionally, the heat conduction plate assembly structure 1 further includes a heat dissipation structure 40. The heat dissipation structure 40 is arranged on a side of the platform 11 away from the arc surface 111 for increasing heat dissipating areas and improving the heat dissipation efficiency. Specifically, the heat dissipation structure 40 may include a plurality of heat dissipation fins. The heat dissipation fins are arranged spacedly and disposed on the platform 11 in one-piece form. Furthermore, the heat dissipation structure 40 may include at least one heat pipe or a plurality of heat pipes, and is attached to one side of the platform 11 away from the arc surface 111. If necessary, one end of the heat pipe may be connected with a heat dissipation fin set in series, which may be applied as an air-cooled heat sink, here is not intended to be limiting.

Figure 4:
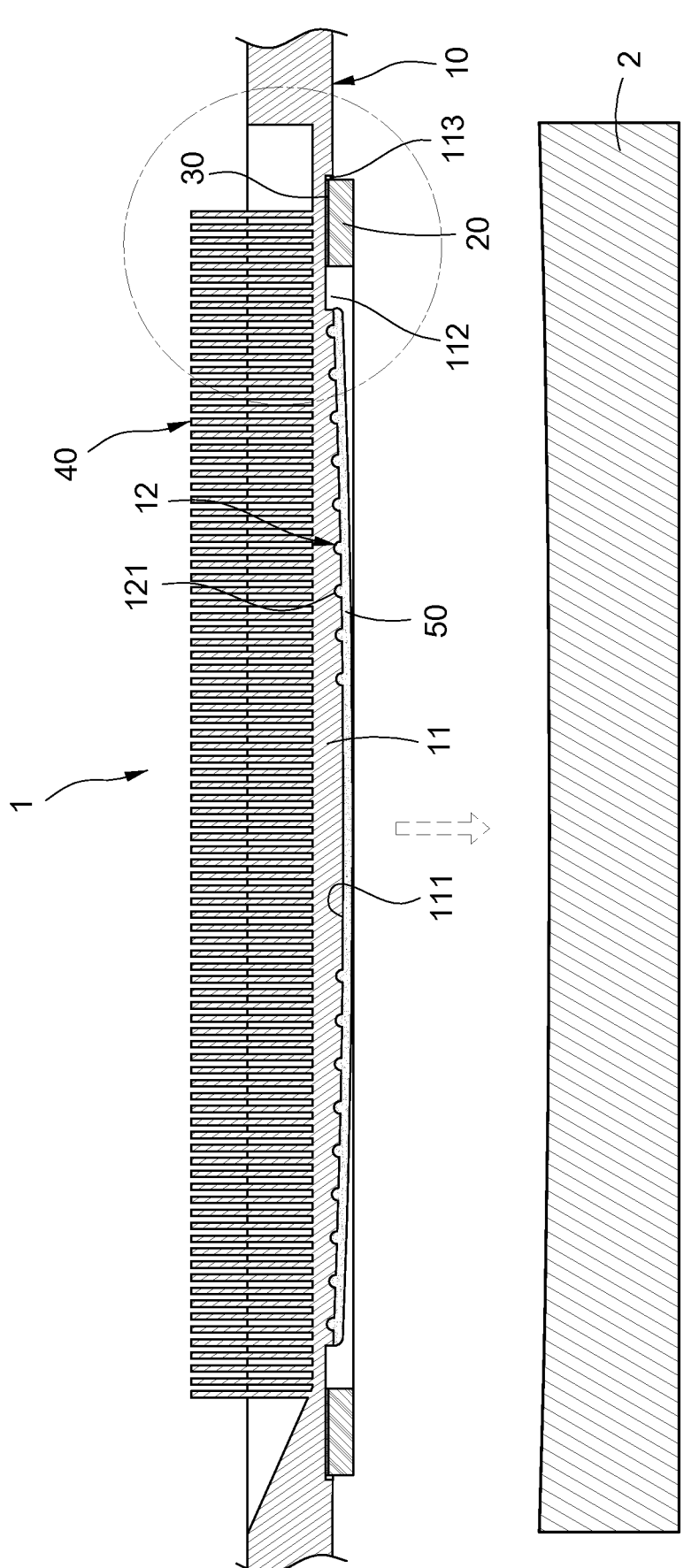
FIG. 4 is an operation schematic view of the heat conduction plate assembly structure in this disclosure.
Figure 5:
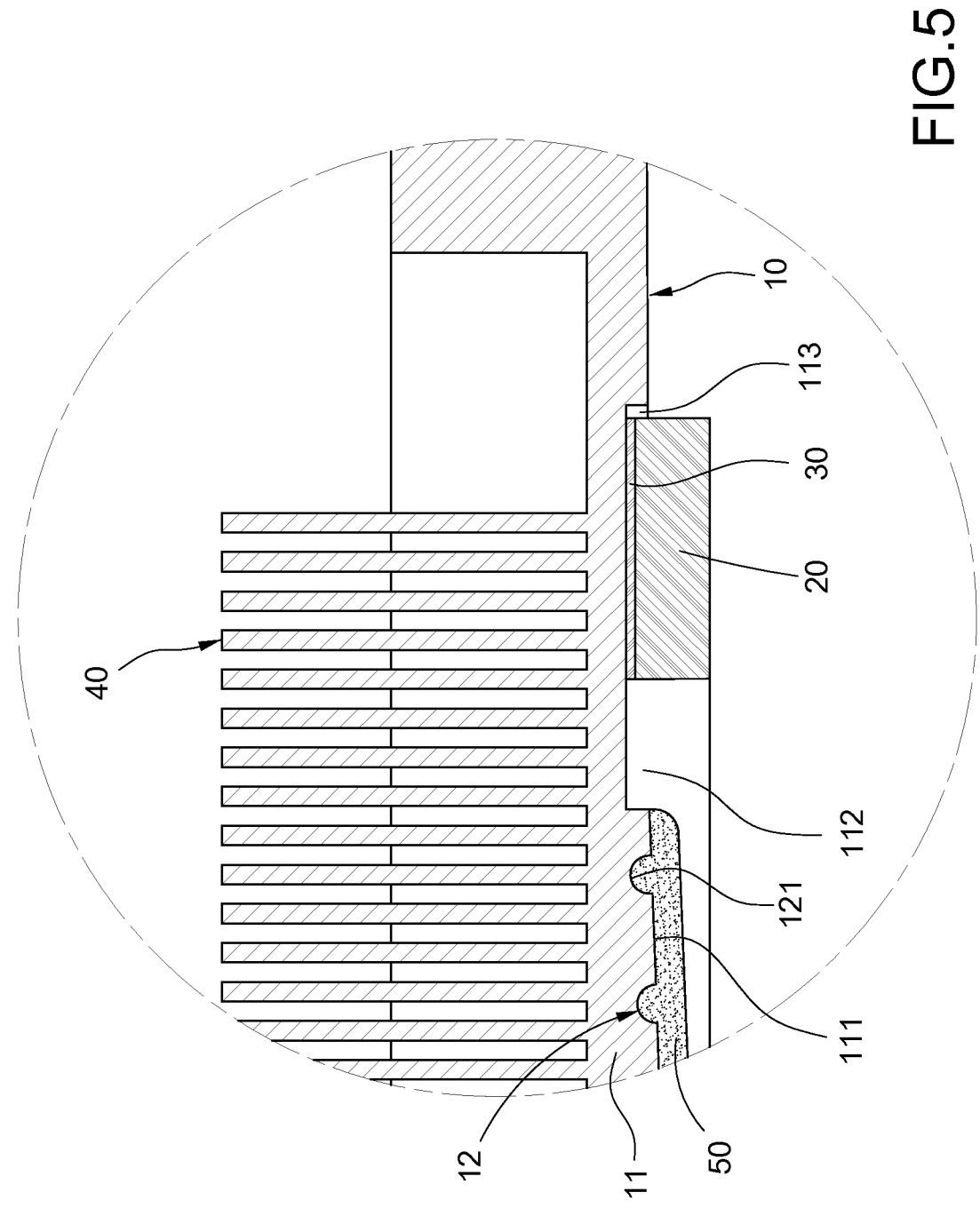
FIG. 5 is a partially enlarged schematic view of the heat conduction plate assembly structure in this disclosure.

Please further refer to FIG. 4 and FIG. 5, which are an operation schematic view of the heat conduction plate assembly structure and a partially enlarged schematic view of the heat conduction plate assembly structure in this disclosure. The heat conduction plate assembly structure 1 of this disclosure further includes a heat conduction medium 50. The heat conduction medium 50 is coated on the arc surface 111, and the arc surface 111 is used for attaching to a heat-generating component 2. The heat conduction medium 50 is a medium with a desirable heat conduction effect, such as heat conduction paste, etc. Specifically, the heat conduction medium 50 is coated on the arc surface 111 and is filled in the grooves 12 (concentric annular grooves 121).

It should be noted that in some embodiments, the arc surface 111 is configured corresponding to the shape of the side where the heat-generating component 2 is attached to the heat conducting plate 10. For example, when the side of the heat-generating component 2 facing the heat conducting plate 10 is a convex surface, the arc surface 111 is configured to a concave arc surface. Moreover, when the side of the heat-generating component 2 facing the heat conducting plate 10 is a concave surface, the arc surface 111 is configured to a convex arc surface.

Figure 6:
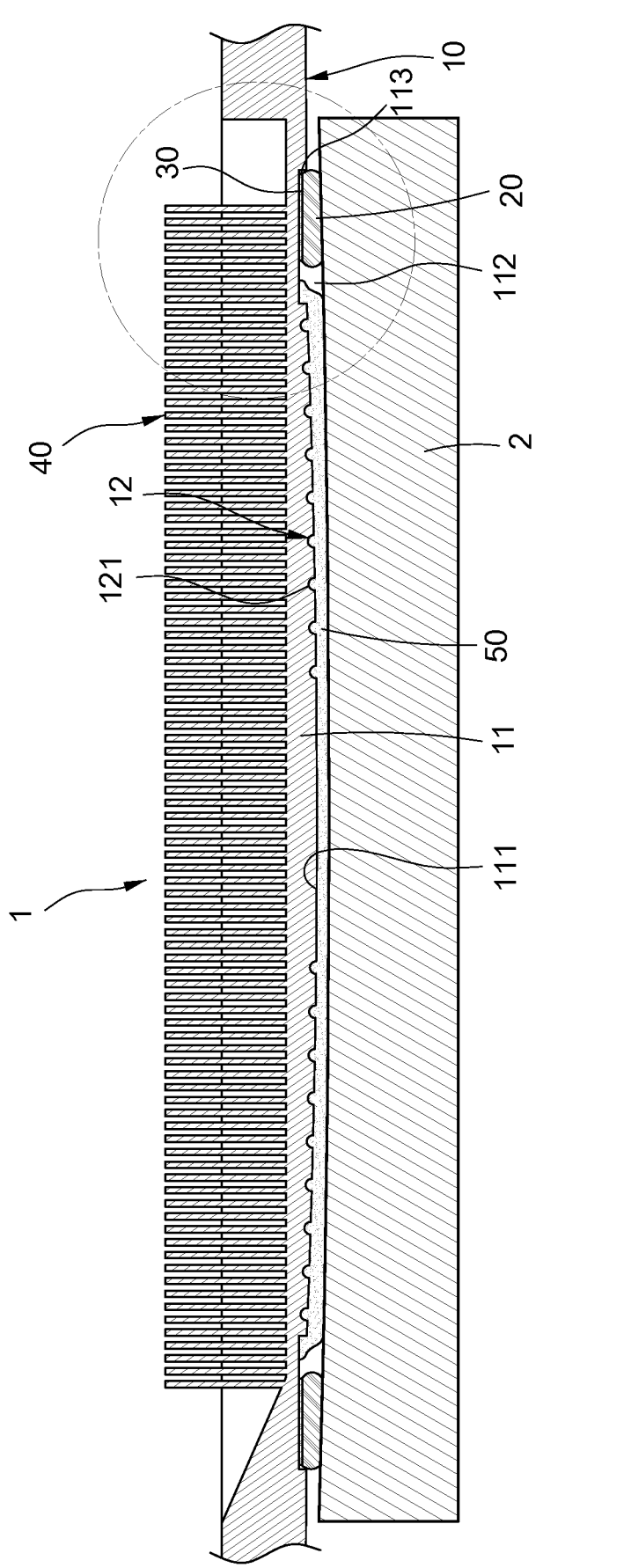
FIG. 6 is a cross-sectional view of the operation of the heat conduction plate assembly structure in this disclosure.
Figure 7:
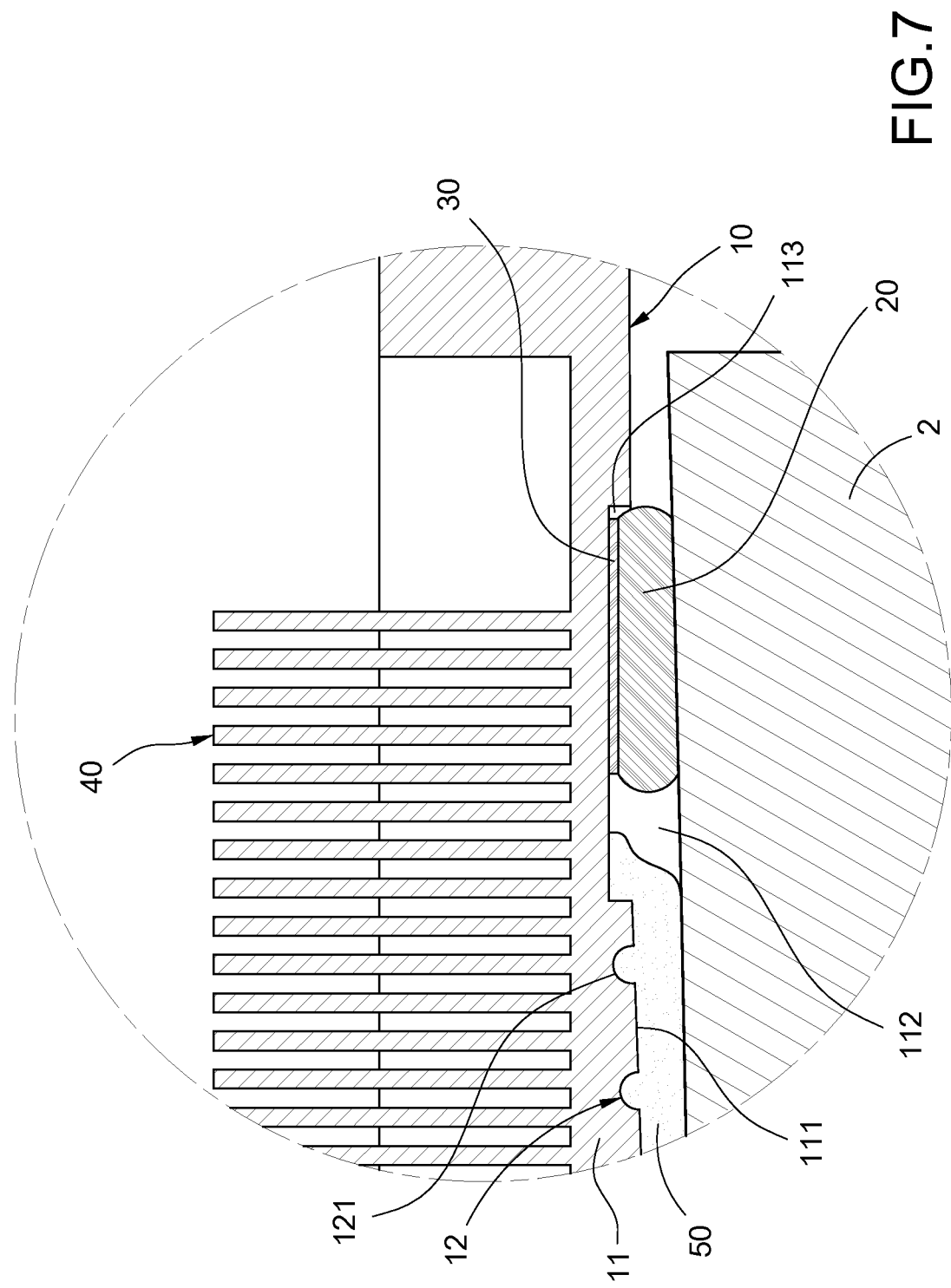
FIG. 7 is a partially enlarged schematic view of the operation of the heat conduction plate assembly structure in this disclosure.

Please refer to FIG. 6 and FIG. 7, which are a cross-sectional view of the operation of the heat conduction plate assembly structure and a partially enlarged schematic view of the operation of the heat conduction plate assembly structure in this disclosure. The heat conduction plate assembly structure 1 of this disclosure is attached to a heat-generating component 2 for conducting the heat of the heat-generating component 2 to the heat conduction plate 10, so that the heat is dissipated through the heat conduction plate 10 of the heat dissipation structure 40. It is worth noting that the heat conduction plate 10 is effectively adhered to the surface of the heat-generating component 2 through the arrangement of the arc surface 111. Therefore, gaps may be eliminated and the heat conduction effect may not be affected.

It should be noted that the melt heat conduction medium 50 or the excess heat conduction medium 50 coated on the arc surface 111 may overflow into the overflow slot 112 when the heat conduction plate assembly structure 1 is attached to the heat-generating component 2.

Figure 8:
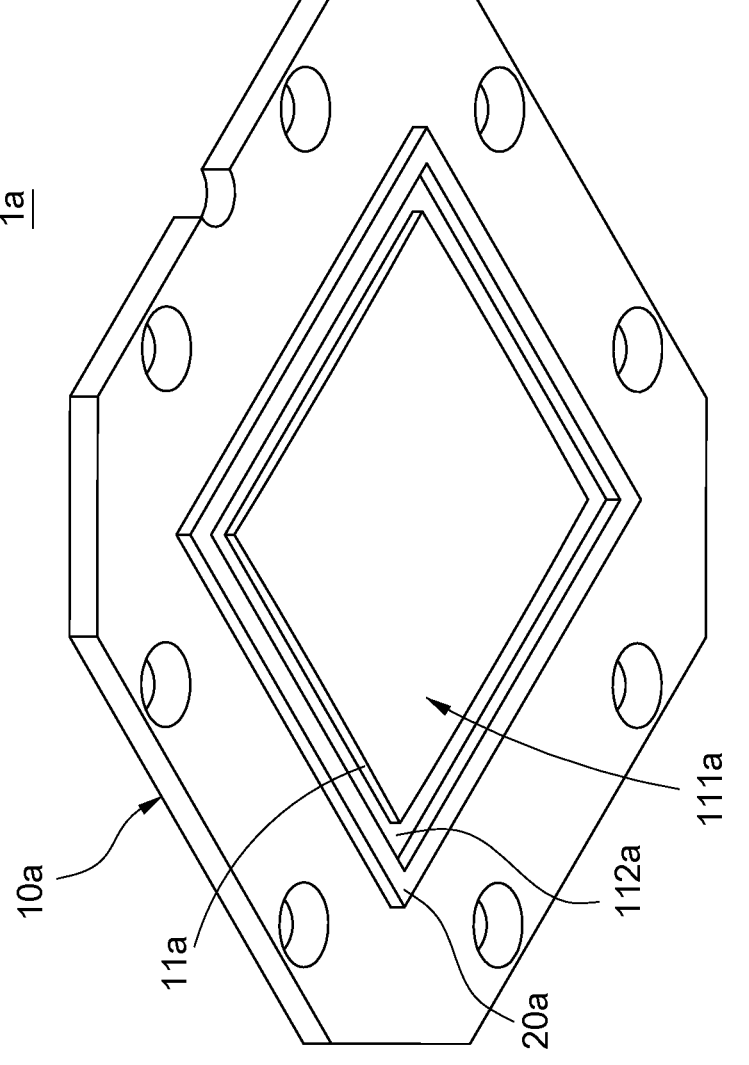
FIG. 8 is a perspective schematic view of another embodiment of the heat conduction plate assembly structure in this disclosure.
Figure 9:
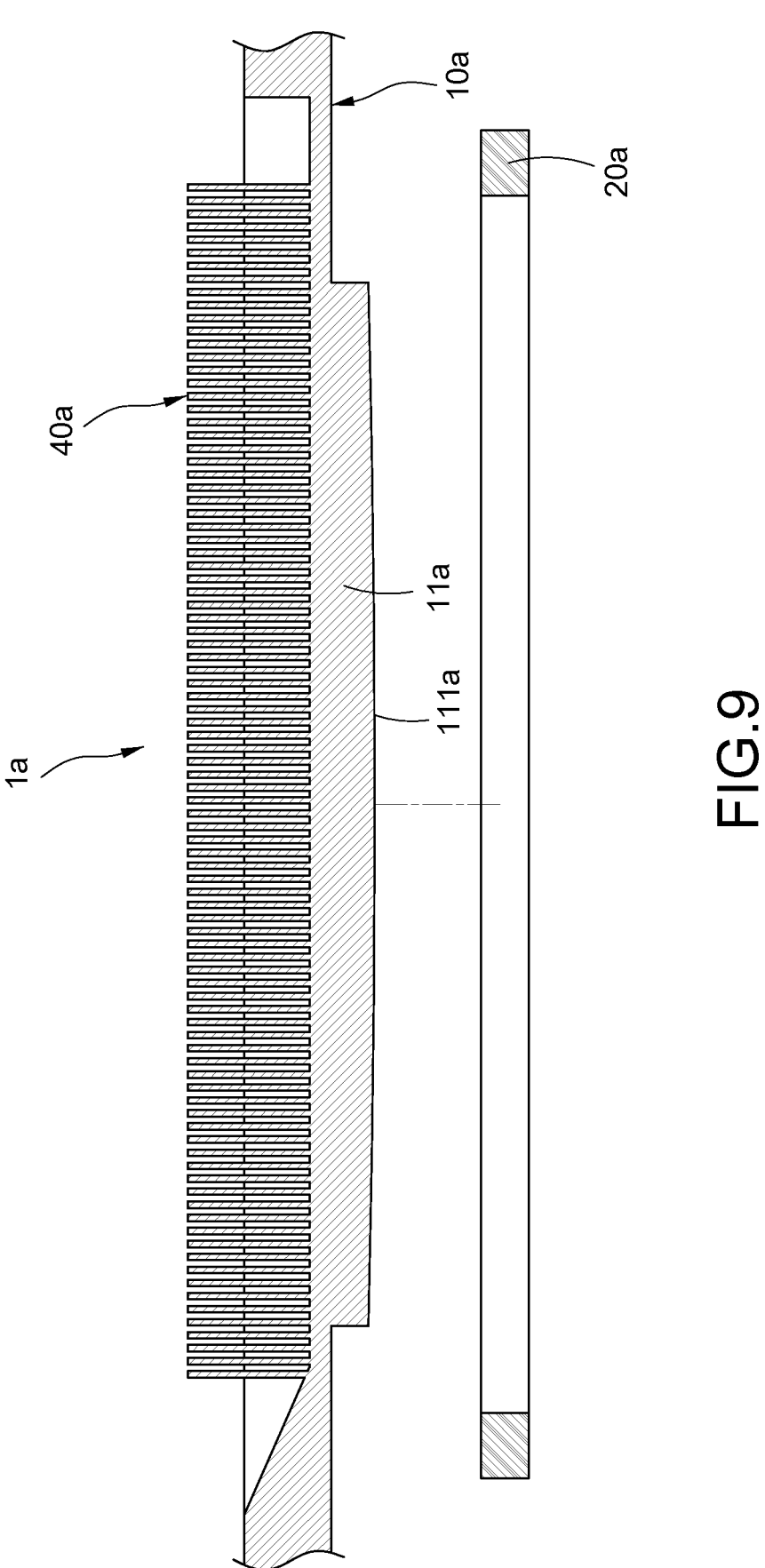
FIG. 9 is a perspective exploded schematic view of another embodiment of the heat conduction plate assembly structure in this disclosure.
Figure 10:
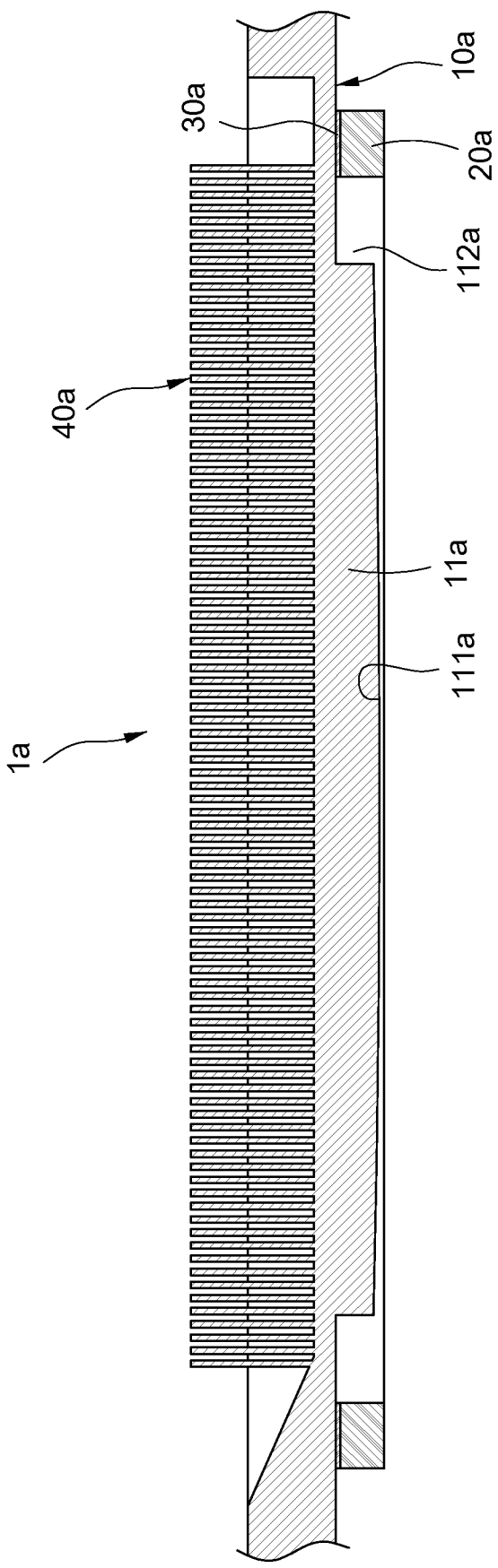
FIG. 10 is a cross-sectional view of another embodiment of the heat conduction plate assembly structure in this disclosure.

Please further refer to FIG. 8 to FIG. 10, which are a perspective schematic view of another embodiment of the heat conduction plate assembly structure, a perspective exploded schematic view of another embodiment of the heat conduction plate assembly structure and a cross-sectional view of another embodiment of the heat conduction plate assembly structure in this disclosure. In this embodiment, the heat conduction plate assembly structure 1a includes a heat conduction plate 10a, a buffer pad 20a and a heat dissipation structure 40a. This embodiment is similar to the previous embodiment, the heat dissipation structure 40a may include a plurality of heat dissipation fins or at least one heat pipe. The heat conduction plate 10a includes a platform 11a. The platform 11a includes an arc surface 111a. The buffer pad 20 is combined on the heat conduction plate 10a. Specifically, the buffer pad 20 surrounds the overflow slot 112. The heat dissipation structure 40a is arranged on one side of the platform 11 away from the arc surface 111.

Comparing with the previous embodiment, this embodiment is different in that the arc surface 111a is not provided with grooves or positioning grooves. The buffer pad 20a surrounds the outer side of the arc surface 111a to form an overflow slot 112a directly. In this embodiment, the overflow slot 112a is configured as a square groove, and the buffer pad 20a is configured as a square pad correspondingly.

It should be noted that in some embodiments, the arc surface 111a may be coated with a heat conducting medium to improve the conduction efficiency between the arc surface 111a and the heat-generating component.

Figure 11:
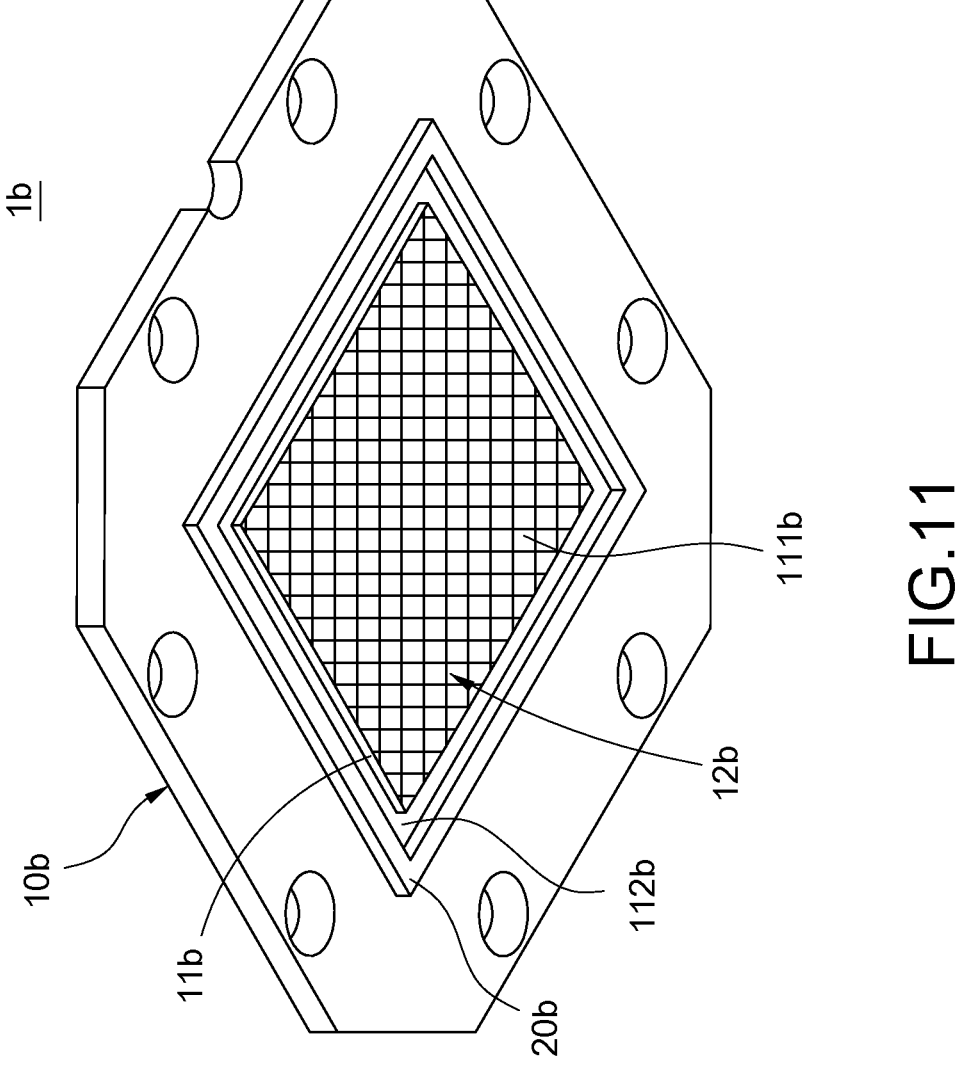
FIG. 11 is a perspective exploded schematic view of still another embodiment of the heat conduction plate assembly structure in this disclosure.

Please refer to FIG. 11, which is a perspective exploded schematic view of still another embodiment of the heat conduction plate assembly structure in this disclosure. In this embodiment, the heat conduction plate assembly structure 1b includes a heat conduction plate 10b and a buffer pad 20b. The heat conduction plate 10b includes a platform 11b. The platform 11b includes an arc surface 111b and an overflow slot 112b located on a side of the arc surface 111b. The difference of this embodiment is that a plurality of grooves 12b are disposed on the arc surface 111b. The grooves 12b are arranged intersectedly in a grid manner, such as rhombus patterns.

It is worth noticing that the number of platforms 11, 11a, 11b or overflow slots 112, 112a, 112b in the embodiments of the heat conduction plate assembly structure of this disclosure may be one or more according to actual needs, and the grooves 12, 12b or concentric annular grooves 121 are disposed on all or part of the surfaces of the platforms 11, 11a, 11b according to the requirements of use, here is not intended to be limiting.

While this disclosure has been described by means of specific embodiments, numerous modifications and variations could be made thereto by those skilled in the art without departing from the scope and spirit of this disclosure set forth in the claims.

What is claimed is:

1. A heat conduction plate assembly structure for attaching to a heat-generating component (2), with a heat conduction medium (50) interposed therebetween, the heat conduction plate assembly structure comprising:

a heat conduction plate (10), comprising a platform (11) disposed corresponding to a center of the heat-generating component (2) and a plurality of holes surrounding the platform (11), the platform (11) comprising an arc surface (111) attached to the heat-generating component (2) and an overflow slot (112) located on a side of the arc surface (111);

a buffer pad (20), fixed on the platform (11) and surrounding an outer side of the overflow slot (112); and a glue (30), wherein the buffer pad (20) is combined on the platform (11) through the glue (30), the glue (30) forms a continuous layer fully covering and conformally contacting an entirely surface of the buffer pad (20) that faces the platform (11), and the glue (30) has a uniform thickness across the entire surface of the buffer pad (20);

wherein the platform (11) comprises a positioning groove (113), and the buffer pad (20) is arranged in and occupying a portion of the positioning groove (113);

wherein a remaining portion of the positioning groove (113) located at an inner side of the buffer pad (20) is left unoccupied and is defined as the overflow slot (112) to receive overflow of the heat conduction medium (50) melted by heat from the heat-generating component (2);

wherein a plurality of heat dissipation fins (40) are disposed within a recess formed on an opposite side of the platform (11), and an outermost of the heat dissipation fins (40) at a first side is spaced apart from a sidewall of the recess by a slot and another outermost of the heat dissipation fins (40) at a second side opposite to the first side is adjacent to a sloping sidewall of the recess.

2. The heat conduction plate assembly structure according to claim 1, wherein a plurality of grooves (12) is defined on the arc surface (111).

3. The heat conduction plate assembly structure according to claim 2, wherein the grooves (12) comprise multiple concentric annular grooves (121) of different sizes, or the grooves (12) are arranged intersectedly in a grid manner.

4. The heat conduction plate assembly structure according to claim 1, further comprising a heat dissipation structure (40) arranged on a side of the platform (11) away from the arc surface (111).

5. The heat conduction plate assembly structure according to claim 1, wherein the overflow slot (112) and the buffer pad (20) are arranged in a circular manner.

6. The heat conduction plate assembly structure according to claim 1, wherein the overflow slot (112) is defined as a circular ring groove or a square groove, and the buffer pad (20) is structured as a circular pad or a square pad.

7. The heat conduction plate assembly structure according to claim 1, wherein a gap is formed between the pad (20) and a sidewall of the outer side of the overflow slot (112).

* * * * *